(12) United States Patent
Lee

(10) Patent No.: US 8,154,933 B2
(45) Date of Patent: Apr. 10, 2012

(54) MODE-REGISTER READING CONTROLLER AND SEMICONDUCTOR MEMORY DEVICE

(75) Inventor: Yin Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 281 days.

(21) Appl. No.: 12/647,679

(22) Filed: Dec. 28, 2009

(65) Prior Publication Data

US 2010/0302873 A1 Dec. 2, 2010

(30) Foreign Application Priority Data

May 28, 2009 (KR) ........................ 10-2009-0047146

(51) Int. Cl.
*G11C 16/04* (2006.01)

(52) U.S. Cl. ................ 365/189.05; 365/233.1; 365/194; 365/189.12

(58) Field of Classification Search ............. 365/189.05, 365/233.1, 194, 189.12, 191, 189.17
See application file for complete search history.

(56) References Cited

U.S. PATENT DOCUMENTS

| 5,812,491 A | 9/1998 | Shinozaki et al. |
| 5,835,448 A * | 11/1998 | Ohtani et al. ............... 365/233.1 |

FOREIGN PATENT DOCUMENTS

| KR | 1019970067830 A | 10/1997 |
| KR | 1020050111442 A | 11/2005 |

* cited by examiner

*Primary Examiner* — David Lam

(74) *Attorney, Agent, or Firm* — Ladas & Parry LLP

(57) ABSTRACT

A mode-register reading controller includes a switching signal generator, first and second transmitters, and a control signal generator. The switching signal generator generates a switching signal that is activated when the reset command is input during a mode-register reading operation. The first transmitter buffers and transfers the mode-register read signal in response to the switching signal. The second transmitter, in response to the switching signal, delays and transfers the enable signal at a predetermined delay time. The control signal generator receives a signal from one of the first and second transmitters and generates a first control signal and a second control signal for transferring the data into a data output buffer from the input/output line.

20 Claims, 4 Drawing Sheets

MODE-REGISTER READING CONTROLLER AND SEMICONDUCTOR MEMORY DEVICE

CROSS-REFERENCES TO RELATED PATENT APPLICATION

The present application claims priority to Korean application number 10-2009-0047146, filed on May 28, 2009, which is incorporated by reference in its entirety.

TECHNICAL FIELD

This disclosure relates to a mode-register reading controller.

BACKGROUND

A register set (hereinafter, referred to as 'RS') is general means for defining operation modes in a semiconductor memory device. RS is usually composed of mode register sets (MRS) and extended mode register sets (EMRS). The mode register sets and the extended mode register sets, which are applied to address pins along with mode register set commands, determine operation modes for a semiconductor memory device. Information about operation modes once determined is maintained until a semiconductor memory device is reprogrammed or power of the semiconductor memory device is cut off or interrupted.

The mode register sets are necessary for dynamic random access memories (DRAM) or static random access memories (SRAM), determining operation modes, such as burst type, burst length, column address strobe (CAS) signal latency (CL) and read latency (RL), before using a semiconductor memory device chip. The mode register sets can be performed under test modes for examining semiconductor memory chips by vendors or under the Joint Electron Device Engineering Council (JEDEC) standard providing operations modes by users.

In the meantime, for a Dual Data Rate 2 (DDR2) DRAM, the mode register set offers a mode register writing (MRW) operation to input mode information set in registers and a mode-register reading (MRR) operation to retrieve the mode information from the registers. In general, the mode-register reading operation is carried out as shown in FIG. 1.

FIG. 1 shows a timing sequence of a general mode-register reading operation for a semiconductor memory device.

Referring to FIG. 1, if a mode-register read command MRR_COMMAND is input to the semiconductor memory device, a mode-register reading period signal MRR_EN is generated which maintains a high level during a mode-register reading period. After a predetermined delay time subsequent to when a more-register reading operation began by the mode-register read command MRR_COMMAND, an enable signal AYP_ROUT is activated into a high level state. The enable signal AYP_ROUT is made from a column enable signal AYP that is used for generating a column selection signal (YI; not shown). If the enable signal AYP_ROUT is activated in a high level, control signals MRR_STB1 and MRR_STB2 are activated into high level states after a predetermined delay time. Here, the control signal MRR_STB1 activated into a high level state is provided to load data into a global input/output line from a mode register in the mode-register reading operation. The control signal MRR_STB2 is provided to drive a pipe latch for transferring data into a data output buffer from the global input/output line.

The timing sequence, as shown in FIG. 1, may correspond to a mode-register reading operation applicable to the DDR800 standard (tCK=2.5 ns) that supports a system set at a read latency of 6tCK, or the higher. As can be seen from FIG. 1, in a high frequency operation, such as at a data rate over that of the DDR800 (tCK=2.5 ns), it is necessary to set the read latency to at least longer than 5tCK in order to output data from the mode register. However, the read latency is reset at 3tCK by a reset command. Thus, in a situation when a reset command is input while the mode-register reading operation is running in at this high frequency, a malfunction can arise because the read latency for outputting data from the mode register cannot be assured in the least term that is 5tCK.

SUMMARY

There is provided a mode-register reading controller capable of preventing a malfunction occurring from an insufficient term of read latency when a reset command is input during a mode-register reading operation of high frequency.

There is also provided a semiconductor memory device having a mode-register reading controller capable of preventing or at least minimizing the occurrence of a malfunction due to an insufficient term of read latency when a reset command is input during a mode-register reading operation of high frequency.

In some embodiments, a mode-register reading controller may include a switching signal generator configured to generate a switching signal that is activated when there is an input of a reset command during a mode-register reading operation, a first transmitter configured to buffer and transfer a mode-register read signal, which is activated after a first delay period from an input of a mode-register read command, in response to the switching signal, a second transmitter configured to delay and transfer an enable signal, which is activated after a second delay period from an input of the mode-register read command, in a predetermined delay time in response to the switching signal, and a control signal generator configured to receive a signal from one of the first and second transmitters and to generate a first control signal, which is for loading data into an input/output line from a mode register, and a second control signal for transferring the data into a data output buffer from the input/output line.

In other embodiments, a semiconductor memory device may include a mode-register reading controller configured to generate a first control signal for loading a mode register data into an input/output line in response to an enable signal, during a mode-register reading operation, and a second control signal for configured to transfer the data into a data output buffer from the global input/output line, the first and second control signals being generated in response to a mode-register read signal if there is an input of a reset command, a mode register loading the data into the input/output line in response to the first control signal, and a pipe latch controller configured to generate a pipe-latch control signal to control a pipe latch transferring the data into the data output buffer from the input/output line.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
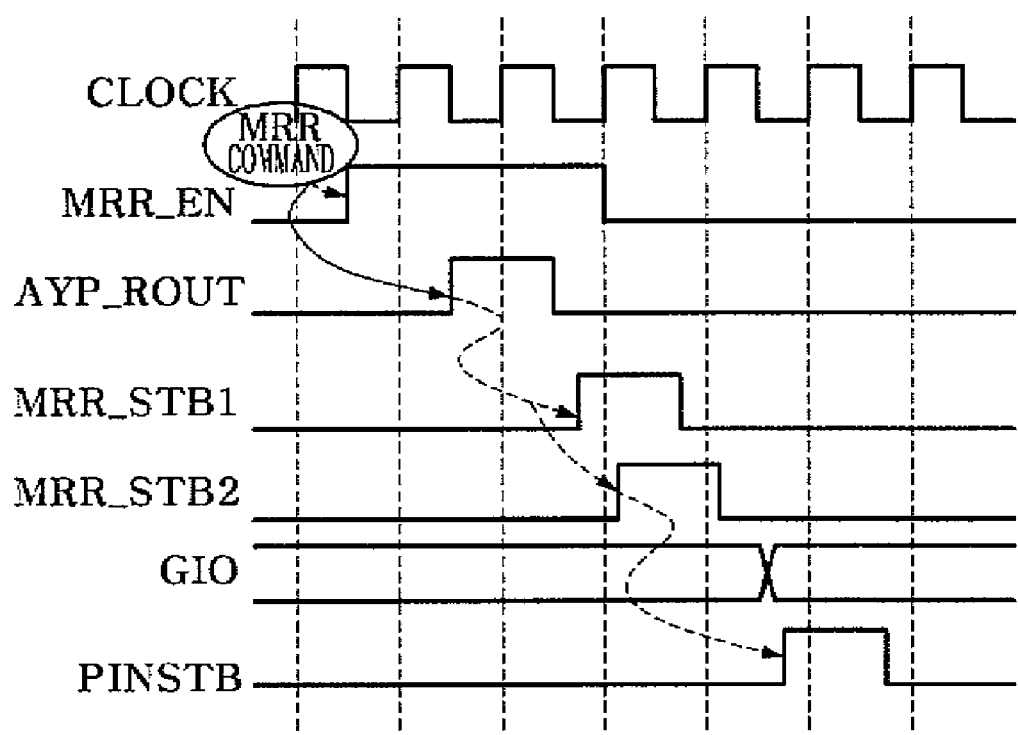
FIG. 1 is a timing diagram showing an operation of a general mode-register reading operation.
Figure 2:
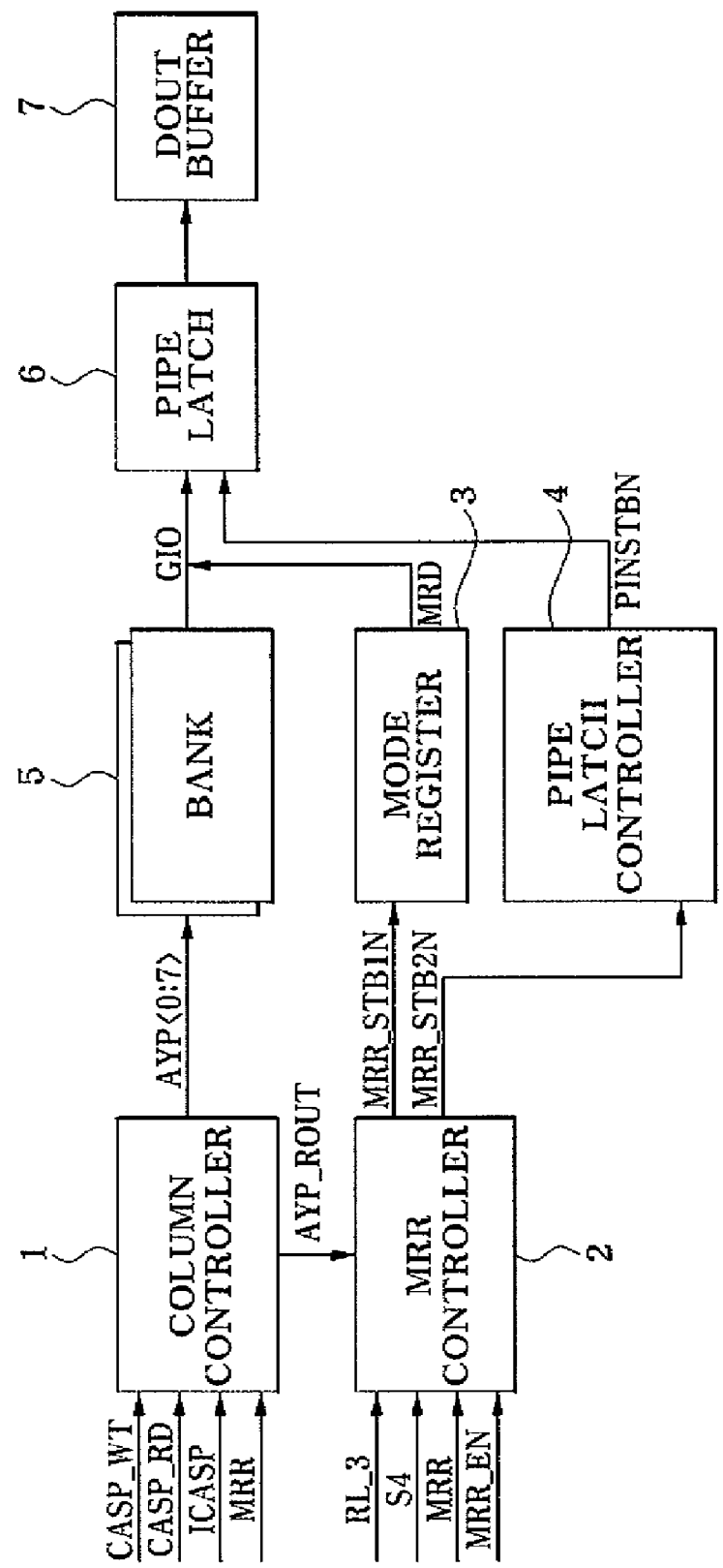
FIG. 2 is a block diagram illustrating a configuration of a semiconductor memory device conducting a mode-register reading operation in accordance with an embodiment of the present invention.

FIG. 2 illustrates a block configuration of a semiconductor memory device conducting a mode-register reading operation in accordance with an embodiment of the present invention.

Referring to FIG. 2, the semiconductor memory device conducting the mode-register reading operation is comprised of a column controller 1, a mode-register reading controller 2, a mode register 3, a pipe latch controller 4, banks 5, a pipe latch 6 and a data output buffer 7.

The column controller 1 receives a write pulse CASP_WT, a read pulse CASP_RD, a burst period pulse ICASP and a mode-register read signal MRR and generates first through eighth column enable signals AYP<0:7> and an enable signal AYP_ROUT. Here, in this illustrative embodiment, the write pulse CASP_WT goes into a high level state when a write command is input to the semiconductor memory device. The read pulse CASP_RD goes into a high level state when a read command is input to the semiconductor memory device. The burst period pulse ICASP is set in an active mode in a high level state during a burst period and the mode-register read signal MRR is activated into a high level state after an input of the mode-register read command MRR_COMAND. The first through eighth column enable signals AYP<0:7> are selectively activated to selectively activate a plurality of column selection signals YI for controlling switches (not shown) that enables data exchanges between bit lines and input/output lines. Thus, the first through eighth column enable signals AYP<0:7> are selectively activated into an active period of the burst period pulse when the write pulse CASP_WP is input for a writing operation or when the read pulse CASP_RD is input for a reading operation. The enable signal AYP_ROUT is generated from the first through eighth column enable signals AYP<0:7> when a pulse of the enable signal AYP_ROUT is input for the mode-register reading operation. That is, an active period of the enable signal AYP_ROUT is established by the first through eighth column enable signals AYP<0:7> which are selectively activated in the burst period.

The mode-register reading controller 2 receives the enable signal AYP_ROUT, a read latency signal RL_3, a mode signal S4, the mode-register read signal MRR and a mode-register reading period signal MRR_EN and is configured to subsequently generate a first control signal MRR_STB1N and to subsequently generate a second control signal MRR_STB2N. In this embodiment, the read latency signal RL_3 is activated into a high level state when the read latency is set on 3tCK (i.e., three times of clock cycle). The mode signal S4 is conditioned into a high level state when the semiconductor memory device is operating in a lower power DDR2 mode. The low power DDR2 mode is understood herein to be the operation mode employed for minimizing power consumption in a mobile apparatus. The mode-register reading period signal MRR_EN is conditioned into a high level state during the mode-register reading operation. The first control signal MRR_STB1N is activated into a high level state to load data into a global input/output line GIO from the mode register 3. The second control signal MRR_ST2N is activated into a high level state to transfer data into the data output buffer 7 from the global input/output line GIO.

Figure 3:
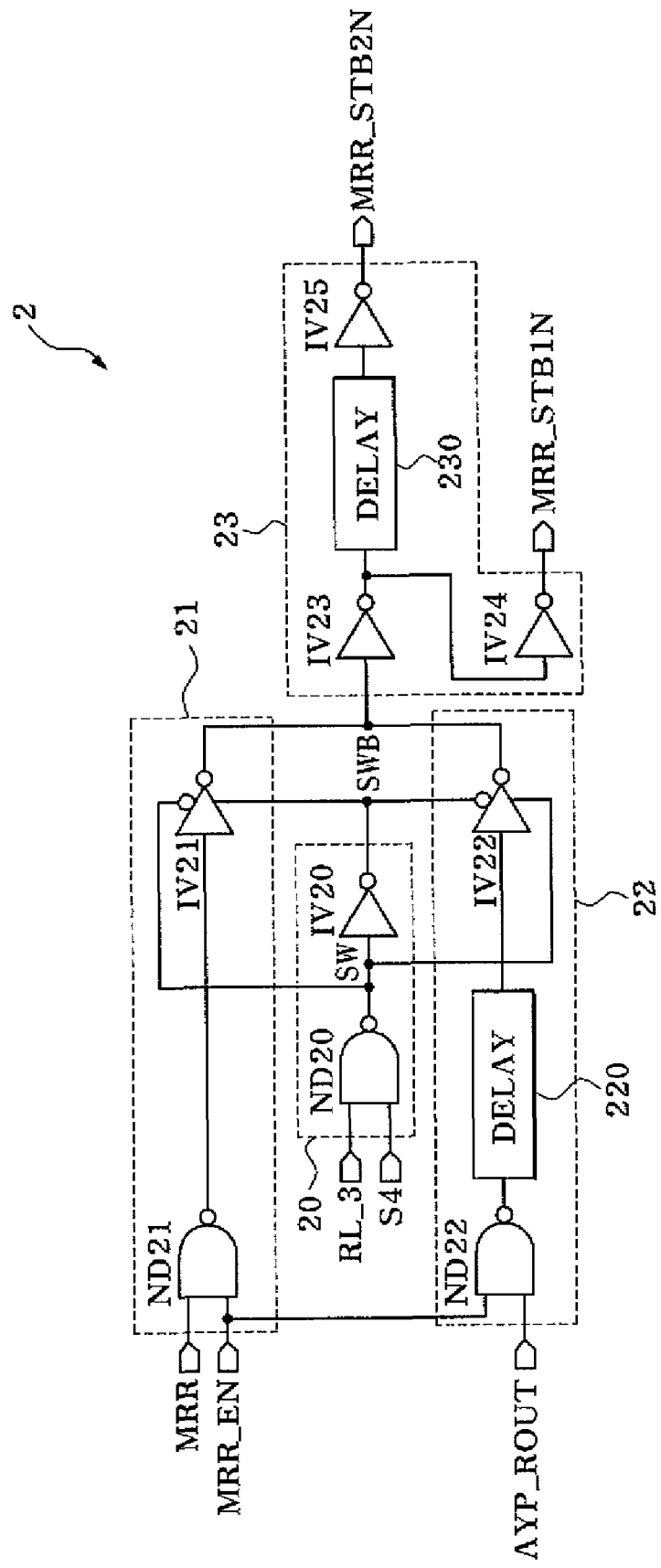
FIG. 3 is a circuit diagram illustrating the mode-register reading circuit included in the semiconductor memory device shown in FIG. 2.

Hereinafter, an embodiment of the mode-register reading controller 2 will be described in detail with reference to FIG. 3. In this embodiment, the mode-register reading controller 2 is shown comprising of a switching signal generator 20, a first transmitter 21, a second transmitter 22 and a control signal generator 23.

The switching signal generator 20 may be formed of a NAND gate ND20 and an inverter IV20 which executes a logical operation with the read latency signal RL_3 and the mode signal S4. With this formation, the switching signal generator 20 operates to generate a switching signal at a low level state and an inverted switching signal SWB at a high level state if the read latency is set to 3tCK in the low-power DDR2 mode.

The first transmitter 21 may be formed of a NAND gate ND21 functioning as a buffer for buffering the mode-register read signal MRR in response to the mode-register reading period signal MRR_EN, and an inverter IV21 functioning as a transmission element for transferring an output signal of the NAND gate ND21 in response to the switching signal SW and the inverted switching signal SWB. With this structure, the first transmitter 21 outputs the mode-register read signal MRR, which is buffered during the mode-register reading period, through the inverter IV21 that is driven when the switching signal SW is set at a low level state and the inverted switching signal SWB is set at a high level state.

The second transmitter 22 may be formed of a NAND gate ND22 functioning as a buffer for buffering the enable signal AYP_ROUT in response to the mode-register reading period signal MRR_EN, a first delay circuit 220 delaying an output signal of the NAND gate ND22 in a predetermined time, and an inverter IV22 functioning as a transmission element for transferring an output signal of the delay circuit 220 in response to the switching signal SW and the inverted switching signal SWB. With this structure, the second transmitter 22 outputs the enable signal AYP_ROUT, which is buffered during the mode-register reading period, through the inverter IV22 that is driven when the switching signal SW is set at a high level state and the inverted switching signal SWB is set at a low level state.

The control signal generator 23 may be formed of inverters IV3~IV25 and a second delay circuit 230. The control signal generator 23 buffers an output signal of the first transmitter 21 or the second transmitter 22 to generate the first control signal MRR_STB1N, buffers and delays the output signal of the first transmitter 21 or the second transmitter 22 to generate the second control signal MRR_STB2N.

The mode register 3 stores data including information about burst type, burst length (BL), CAS latency (CL) and read latency (RL) which are determined before using the semiconductor memory device chip. The mode register 3 is enabled to load its data into the global input/output line GIO in the period of inputting the first control signal that is activated to a high level.

The pipe latch controller 4 generates a pipe-latch control signal PINSTBN which is activated to a high level if the second control signal MRR_STB2N is actively input in a high level. The pipe latch controller 4 is enabled in response to the pipe-latch control signal PINSTBN and output data from the global input/output line GIO.

The bank 5 includes a memory cell array and a number of control circuits for controlling the memory cell array. From the memory cell array of the bank 5, data are selectively loaded into the global input/output line GIO by the first through eighth column enable signals AYP<0:7> selectively activated in the reading or writing operation.

Figure 4:
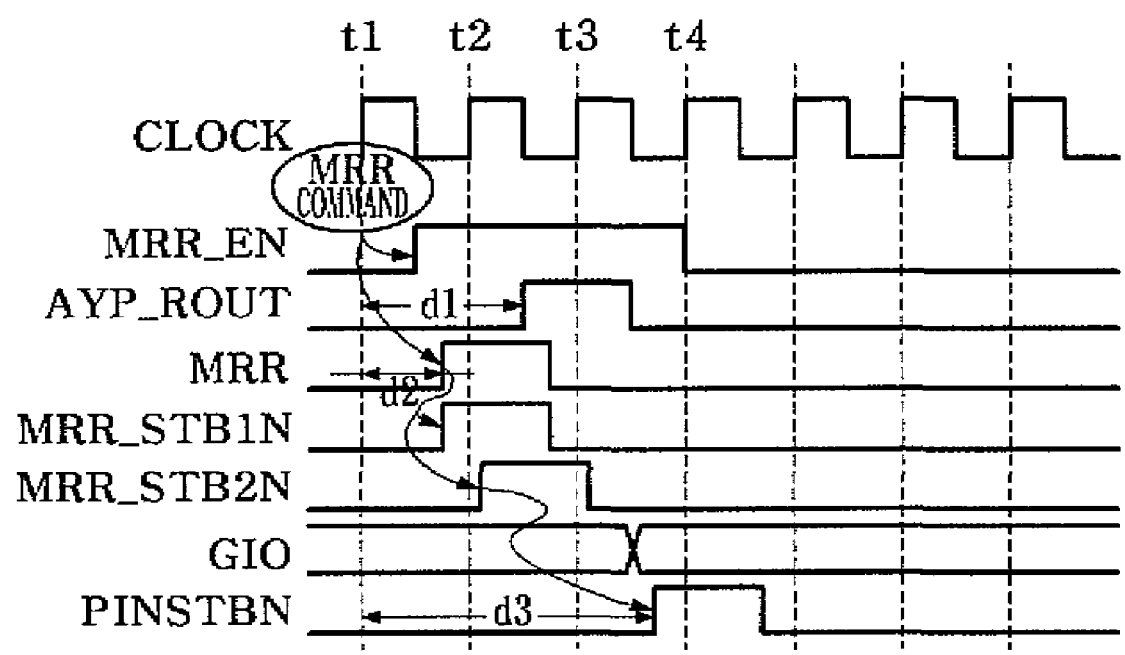
FIG. 4 is a timing diagram showing an operation by the mode-register reading circuit of the semiconductor memory device shown in FIG. 2.

Now the mode-register reading operation of the semiconductor memory device will be hereinafter described in conjunction with FIG. 4.

First, if the mode-register read command MRR_COMMAND is input for the mode-register reading operation, then the mode-register reading period signal MRR_EN is generated to be active in a high level during the mode-register reading period. After a period d2 from the input of the mode-register read command MRR_COMMAND, the mode-register read signal MRR is then input with a high level pulse.

Then, the column controller 1 receives the high level pulse of the of the mode-register read signal MRR and generates the enable signal AYP_ROUT that is activated in a high level pulse after a period d1 from the input of the mode-register read command MRR_COMMAND. During this, the enable signal AYP_ROUT is selectively generated from the first through eighth column enable signals AYP<0:7> and later than the mode-register read signal MRR in activation time.

Next, the mode-register reading controller 2 receives the enable signal AYP_ROUT, the read latency signal RL_3, the mode signal S4, the mode-register read signal MRR and the mode-register reading period signal MRR_EN, and generates the first control signal MRR_STB1N and the second control signal MRR_STB2N. Here, active periods of the first control signal MRR_STB1N and the second control signal MRR_STB2N are variable in accordance with whether there is an input of a reset command RESET during the mode-register reading operation. Therefore, the following description about the mode-register reading controller 2 will proceed in connection with two cases: one case is that there is no input of the reset command RESET; and the other case is that there is an input of the reset command RESET.

In the first case, if there is no input of the reset command RESET during the mode-register reading operation, the read latency is set to be longer than 3tCK. Thus, the read latency signal RL_3 is conditioned in a low level state. Accordingly, the switching signal SW is generated in a high level state and the inverted switching signal SWB is generated in a low level state, so that the inverter IV21 is disabled but the inverter IV2 is enabled. Thereby, the mode-register reading controller 23 delays and buffers the enable signal AYP_ROUT by way of the second transmitter 22 and the control signal generator 23 to generate the first control signal MRR_STB1N and the second control signal MRR_STB2N.

In the other case, if there is an input of the reset command RESET during the mode-register reading operation, the read latency is reset to 3tCK. Thus, the read latency signal RL_3 is conditioned in a high level state. Accordingly, the switching signal SW is generated in a low level state and the inverted switching signal SWB is generated in a high level state, so that the inverter IV21 is enabled but the inverter IV2 is disabled. Thereby, the mode-register reading controller 23 delays and buffers the enable signal AYP_ROUT by way of the first transmitter 21 and the control signal generator 23 to generate the first control signal MRR_STB1N and the second control signal MRR_STB2N.

As stated above, with the semiconductor memory device conducting the mode-register reading operation according to this embodiment, the first control signal MRR_STB1N and the second control signal MRR_STB2N are generated from the mode-register read signal MRR that is earlier than the enable signal AYP_ROUT in active time if there is an input of the reset command RESET during the mode-register reading operation. Hence, the operations of loading data into the global input/output line GIO from the mode register 3 and transferring the data into the data output buffer 7 from the global input/output line GIO are carried out in the read latency that is re-defined within 3tCK by the reset command RESET. As a result, it is possible to present or at least minimize the occurrence of a malfunction due to the insufficiency of the read latency.

While the present invention has been described with respect to the specific embodiments, it will be apparent to those skilled in the art that various changes and modifications may be made without departing from the spirit and scope of the invention as defined in the following claims.

What is claimed is:

1. A mode-register reading controller, comprising:
  a switching signal generator configured to generate a switching signal in an activated state when a reset command during a mode-register reading operation is input;
  a first transmitter, in response to the switching signal, is configured to buffer and transfer a mode-register read signal in an activated state after a first delay period from an input of a mode-register read command;
  a second transmitter, in a predetermined delay time in response to the switching signal, is configured to delay and transfer an enable signal in an activated state after a second delay period from an input of the mode-register read command; and
  a control signal generator configured to receive a signal from one of the first and second transmitters, to generate a first control signal for loading data into an input/output line from a mode register, and to generate a second control signal for transferring the data into a data output buffer from the input/output line.

2. The mode-register reading controller of claim 1, wherein the switching signal generator generates the switching signal in response to a read latency signal in an activated state when there is an input of the reset command during the mode-register reading operation.

3. The mode-register reading controller of claim 2, wherein the switching signal generator when in a low-power DDR2 mode, executes a logical operation using the read latency signal and a mode signal which is in an activated state.

4. The mode-register reading controller of claim 1, wherein the first transmitter comprises:
  a buffer configured to buffer the mode-register read signal during the mode-register reading operation; and
  a transmission element configured to transfer an output signal of the buffer in response to the switching signal.

5. The mode-register reading controller of claim 1, wherein the second transmitter comprises:
  a buffer configured to buffer the enable signal during the mode-register reading operation;
  a delay circuit configured to delay an output signal of the buffer in a predetermined delay period; and
  a transmission element configured to transfer an output signal of the delay circuit in response to the switching signal.

6. The mode-register reading controller of claim 1, wherein the first delay period is shorter than the second delay period.

7. The mode-register reading controller of claim 1, wherein the control signal generator generates the second control signal in an activated state after generating the first control signal by a predetermined delay time.

8. The mode-register reading controller of claim 1, wherein the control signal generator comprises:

a first buffer configured to buffer a signal transferred from one of the first and second transmitters;

a second buffer configured to generate the first control signal by buffering an output signal of the first buffer;

a delay circuit configured to delay the output signal of the first buffer by a predetermined delay period; and a third buffer configured to generate the second control signal by buffering an output signal of the delay circuit.

9. A semiconductor memory device, comprising:

a mode-register reading controller configured to generate a first control signal for loading data into an input/output line in response to an enable signal, during a mode-register reading operation, and configured to generate a second control signal for transferring the data into a data output buffer from the global input/output line, the first and second control signals being generated in response to a mode-register read signal when there is a reset command is input;

a mode register configured to load the data into the input/output line in response to the first control signal; and a pipe latch controller configured to generate a pipe-latch control signal to control a pipe latch transferring the data into the data output buffer from the input/output line.

10. The semiconductor memory device of claim 9, wherein the mode-register read signal is in an activated state after a first delay period from an input of a mode-register read command and the enable signal is in an activated state after a second delay period from the input of the mode-register read command.

11. The semiconductor memory device of claim 10, wherein the first delay period is shorter than the second delay period.

12. The semiconductor memory device of claim 9, wherein the mode-register reading controller comprises:

a switching signal generator configured to generate a switching signal in an activated state during a mode-register reading operation when the reset command is input;

a first transmitter configured to buffer and transfer the mode-register read signal in response to the switching signal;

a second transmitter, in respond to the switching signal, is configured to delay and transfer the enable signal by a predetermined delay time; and a control signal generator configured to receive a signal from one of the first and second transmitters and to generate a first control signal and a second control signal.

13. The semiconductor memory device of claim 12, wherein the switching signal generator generates the switching signal in response to a read latency signal in an activated state when the reset command is input.

14. The semiconductor memory device of claim 13, wherein the switching signal generator, when in a low-power DDR2 mode, executes a logical operation using the read latency signal and a mode signal in an activated state.

15. The semiconductor memory device of claim 12, wherein the first transmitter comprises:

a buffer configured to buffer the mode-register read signal during the mode-register reading operation; and a transmission element configured to transfer an output signal of the buffer in response to the switching signal.

16. The semiconductor memory device of claim 12, wherein the second transmitter comprises:

a buffer configured to buffer the enable signal during the mode-register reading operation;

a delay circuit configured to delay an output signal of the buffer in a predetermined delay period; and a transmission element configured to transfer an output signal of the delay circuit in response to the switching signal.

17. The semiconductor memory device of claim 12, wherein the control signal generator generates, at a predetermined delay time after generating the first control signal, the second control signal in an activated state.

18. The semiconductor memory device of claim 12, wherein the control signal generator comprises:

a first buffer configured to buffer a signal transferred from one of the first and second transmitters;

a second buffer configured to generate the first control signal by buffering an output signal of the first buffer;

a delay circuit configured to delay the output signal of the first buffer in a predetermined delay period; and a third buffer configured to generate the second control signal by buffering an output signal of the delay circuit.

19. The semiconductor memory device of claim 9, wherein the mode register stores information of predetermined operation modes and loads the data into the input/output line.

20. The semiconductor memory device of claim 9, wherein the pipe latch controller generates the pipe-latch control signal in an activated state when the second control signal is in an activated state, and drives the pipe latch.

* * * * *